United States Patent
Kato et al.

(10) Patent No.: US 7,952,128 B2
(45) Date of Patent: May 31, 2011

(54) SEMICONDUCTOR DEVICE

(75) Inventors: Shinjiro Kato, Chiba (JP); Jun Osanai, Chiba (JP)

(73) Assignee: Seiko Instruments Inc., Chiba (JP)

( * ) Notice: Subject to any disclaimer, the term of this patent is extended or adjusted under 35 U.S.C. 154(b) by 124 days.

(21) Appl. No.: 12/545,431

(22) Filed: Aug. 21, 2009

(65) Prior Publication Data

US 2010/0044765 A1 Feb. 25, 2010

(30) Foreign Application Priority Data

Aug. 25, 2008 (JP) ................................ 2008-215125

(51) Int. Cl.
*H01L 27/108* (2006.01)

(52) U.S. Cl. .................. 257/296; 257/E29.345; 257/68; 257/E21.422; 257/E21.545; 257/E21.646; 257/71; 257/301; 257/315; 257/316; 257/329; 438/259; 438/175

(58) Field of Classification Search .................. 257/296, 257/E29.345, 68, 288, E21.422, E21.545, 257/E21.646, 71, 301, 315, 316, 329; 438/259, 438/175

See application file for complete search history.

(56) References Cited

U.S. PATENT DOCUMENTS

| | | | |
|---|---|---|---|
| 4,969,022 A * | 11/1990 | Nishimoto et al. | 257/301 |
| 6,015,990 A * | 1/2000 | Hieda et al. | 257/310 |
| 6,020,610 A * | 2/2000 | Ueno et al. | 257/315 |
| 6,072,208 A * | 6/2000 | Nishihara | 257/296 |
| 6,111,286 A * | 8/2000 | Chi et al. | 257/315 |
| 6,198,151 B1 * | 3/2001 | Wada | 257/520 |
| 6,207,989 B1 * | 3/2001 | Li et al. | 257/314 |
| 6,384,447 B2 * | 5/2002 | Mihnea et al. | 257/314 |
| 6,417,023 B2 * | 7/2002 | Suzuki et al. | 438/73 |
| 6,838,742 B2 * | 1/2005 | Rhodes | 257/448 |
| 7,102,184 B2 * | 9/2006 | Rhodes | 257/292 |
| 7,109,544 B2 * | 9/2006 | Schloesser et al. | 257/302 |
| 7,109,552 B2 * | 9/2006 | Wu | 257/335 |
| 7,259,421 B2 * | 8/2007 | Hur et al. | 257/315 |
| 7,276,747 B2 * | 10/2007 | Loechelt et al. | 257/288 |
| 7,342,272 B2 * | 3/2008 | Abbott | 257/296 |
| 7,465,598 B2 * | 12/2008 | Tatani et al. | 438/48 |
| 7,498,188 B2 * | 3/2009 | Fan et al. | 438/60 |
| 7,851,855 B2 * | 12/2010 | Chun | 257/330 |
| 2002/0110984 A1 * | 8/2002 | Liou et al. | 438/259 |
| 2002/0158277 A1 * | 10/2002 | Harada et al. | 257/288 |
| 2004/0007729 A1 * | 1/2004 | Kokubun | 257/301 |
| 2005/0020086 A1 * | 1/2005 | Kim et al. | 438/700 |

(Continued)

FOREIGN PATENT DOCUMENTS

JP 02-165663 A 6/1990

(Continued)

*Primary Examiner* — N Drew Richards
*Assistant Examiner* — Ankush k Singal
(74) *Attorney, Agent, or Firm* — Brinks Hofer Gilson & Lione

(57) ABSTRACT

Provided is a metal oxide semiconductor (MOS) capacitor, in which trenches (3) are formed in a charge accumulation region (6) of a p-type silicon substrate (1) to reduce a contact area between the p-type silicon substrate (1) and a lightly doped n-type well region (2), thereby reducing a leak current from the lightly doped n-type well region (2) to the p-type silicon substrate (1).

2 Claims, 1 Drawing Sheet

U.S. PATENT DOCUMENTS

| | | | |
|---|---|---|---|
| 2005/0037559 A1* | 2/2005 | Osanai | 438/199 |
| 2005/0045940 A1* | 3/2005 | Chen et al. | 257/315 |
| 2005/0116259 A1* | 6/2005 | Komori | 257/222 |
| 2006/0240613 A1* | 10/2006 | Wang | 438/242 |
| 2007/0082442 A1* | 4/2007 | Kim | 438/243 |
| 2007/0159547 A1* | 7/2007 | Tanaka et al. | 348/309 |
| 2007/0253257 A1* | 11/2007 | Wang | 365/185.29 |
| 2008/0153233 A1* | 6/2008 | Abbott | 438/261 |
| 2008/0258199 A1* | 10/2008 | Lee | 257/316 |
| 2011/0027932 A1* | 2/2011 | TATANI et al. | 438/57 |

FOREIGN PATENT DOCUMENTS

| | | |
|---|---|---|
| JP | 2002-359294 A | 12/2002 |
| JP | 2005-056872 A | 3/2005 |

* cited by examiner

SEMICONDUCTOR DEVICE

RELATED APPLICATIONS

This application claims priority under 35 U.S.C. §119 to Japanese Patent Application No. JP2008-215125 filed on Aug. 25, 2008, the entire content of which is hereby incorporated by reference.

BACKGROUND OF THE INVENTION

1. Field of the Invention

The present invention relates to a semiconductor device in which a leak current from a metal-oxide-semiconductor (MOS) capacitor to a silicon substrate is suppressed.

2. Description of the Related Art

When a MOS capacitor is formed on a silicon substrate and used at the same voltage as that applied to the silicon substrate, an electrode for the silicon substrate side of the MOS capacitor must be formed on a well region of an opposite conductivity to the silicon substrate. When the MOS capacitor has a large area and is used under a high temperature, in particular, the leak current becomes considerably large between the silicon substrate and the well region in which the electrode for the silicon substrate side is formed, causing a problem in circuit construction.

Conventional ways of avoiding the above-mentioned leak current include a method involving forming a capacitor with a first polysilicon layer and a second polysilicon layer being opposing electrodes, and a method involving separating, as in silicon on insulator (SOI), the silicon substrate and the well region in which the electrode on the silicon substrate side is formed, by an oxide film.

Apart from the problem of the leak current, as a way of realizing high integration of capacitors in a dynamic random access memory (DRAM) cell, conventionally, a trench capacitor which is formed by utilizing a recess surface of a trench formed in a silicon substrate has been used as described in JP 02-165663 A.

As has been described above, as a way of suppressing the leak current parasitically flowing from the capacitor to another circuit, when the capacitor is formed of two polysilicon layers, there is a need to add a step of forming the second polysilicon layer, and because the leak current between the electrodes is large compared with a capacitor formed of a silicon substrate and polysilicon interposing a gate oxide film therebetween, quality of an insulating film between the first polysilicon layer and the second polysilicon layer needs to be optimized. Further, when the well and the silicon substrate are separated by the oxide film using a SOI substrate, a cost for the substrate increases, becoming a problem.

SUMMARY OF THE INVENTION

Instead of using the two polysilicon layers or the SOI substrate as described above, the present invention utilizes a trench capacitor to reduce a contact area between a silicon substrate and a well which serves as an electrode on a silicon substrate side of a capacitor, thereby suppressing a leak current between the silicon substrate and the well which serves as the electrode on the silicon substrate side.

Specifically, the present invention provides a semiconductor device including a metal oxide semiconductor (MOS) capacitor, comprising: a silicon substrate of a first conductivity type; a lightly doped well region of a second conductivity type, which is formed by diffusing impurities into the silicon substrate; a charge accumulation region formed in the lightly doped well region of the second conductivity type; trenches formed in the charge accumulation region; a heavily doped region of the second conductivity type, which is formed outside the charge accumulation region and has a higher impurity concentration than an impurity concentration of the lightly doped well region of the second conductivity type; an oxide film formed in the trenches formed in the charge accumulation region and on a surface of the silicon substrate of the first conductivity type; a polysilicon electrode formed on the oxide film; and a substrate-side electrode formed to make contact with the heavily doped region of the second conductivity type.

The present invention also provides a semiconductor device including a MOS capacitor, comprising: a silicon substrate of a first conductivity type; a lightly doped well region of a second conductivity type, which is formed by diffusing impurities into the silicon substrate; a charge accumulation region formed in the lightly doped well region of the second conductivity type; trenches formed in the charge accumulation region; a heavily doped region of the second conductivity type, which is formed outside the charge accumulation region and has a higher impurity concentration than an impurity concentration of the lightly doped well region of the second conductivity type; a heavily doped charge accumulation region of the second conductivity type formed in the trenches formed in the charge accumulation region and on a surface of the silicon substrate of the first conductivity type; an oxide film formed on the heavily doped charge accumulation region of the second conductivity type; a polysilicon electrode formed on the oxide film; and a substrate-side electrode formed to make contact with the heavily doped region of the second conductivity type.

With the above-mentioned means, the contact area between the silicon substrate of the first conductivity type and the well region of the second conductivity type may be reduced, and hence the leak current between the silicon substrate of the first conductivity type and the well region of the second conductivity type may be reduced.

DETAILED DESCRIPTION OF THE PREFERRED EMBODIMENTS

Exemplary embodiments of the present invention are described below with reference to the accompanying drawings.

Figure 1:
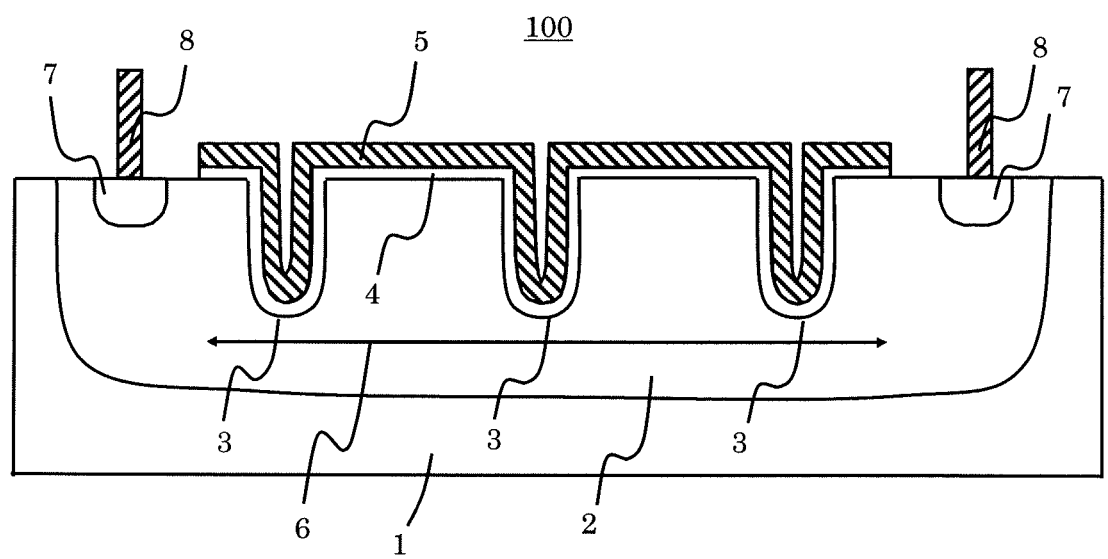
FIG. 1 is a cross-sectional view of a semiconductor device according to a first embodiment of the present invention.

FIG. 1 is a cross-sectional view of a semiconductor device 100 according to a first embodiment of the present invention. The semiconductor device 100 has the following structure. For example, in a p-type silicon substrate 1 having a resistance of 20 to 30 Ωcm, a lightly doped n-type well region 2 is formed to a depth of 20 µm with an impurity such as phosphorus at a concentration of about $1 \times 10^{16}$ cm$^{-3}$. Further, a heavily doped n-type region 7 to make contact with a substrate-side electrode 8 is formed on a part of a surface of the lightly doped n-type well region 2. The heavily doped n-type region 7 has a concentration of $1 \times 10^{24}$ cm$^{-3}$ and uses phosphorus or arsenic as an impurity species.

Subsequently, a plurality of trenches 3 each having a depth of 5 to 10 µm and an opening width of 2 to 3 µm are formed on a surface of the silicon substrate 1. After forming the trenches 3, the silicon substrate 1 is thermally oxidized to form an oxide film 4 with a thickness of 500 Å on the surface of the silicon substrate 1 and inner walls of the trenches 3. On the oxide film 4, a polysilicon film is deposited to a thickness of 4,000 Å, impurities are introduced to the polysilicon film to impart electrical conductivity, and then the polysilicon film is patterned to form a polysilicon electrode 5 on the lightly doped n-type well region 2 including the plurality of trenches 3. A region below the electrode 5 is called a charge accumulation region 6 and serves as a capacitor. Then, an aluminum alloy is formed to a thickness of approximately 5,000 Å as the substrate-side electrode 8 on the heavily doped n-type region 7.

By forming the trenches 3 in the charge accumulation region 6 as described above, a contact area between the p-type silicon substrate 1 and the lightly doped n-type well region 2 may be reduced, and hence a leak current between the p-type silicon substrate 1 and the lightly doped n-type well region 2 may be reduced. Note that the substrate and the well region have been described to be p-type and n-type, respectively, but the conductivity type may be opposite so that the substrate is n-type and the well region is p-type.

Figure 2:
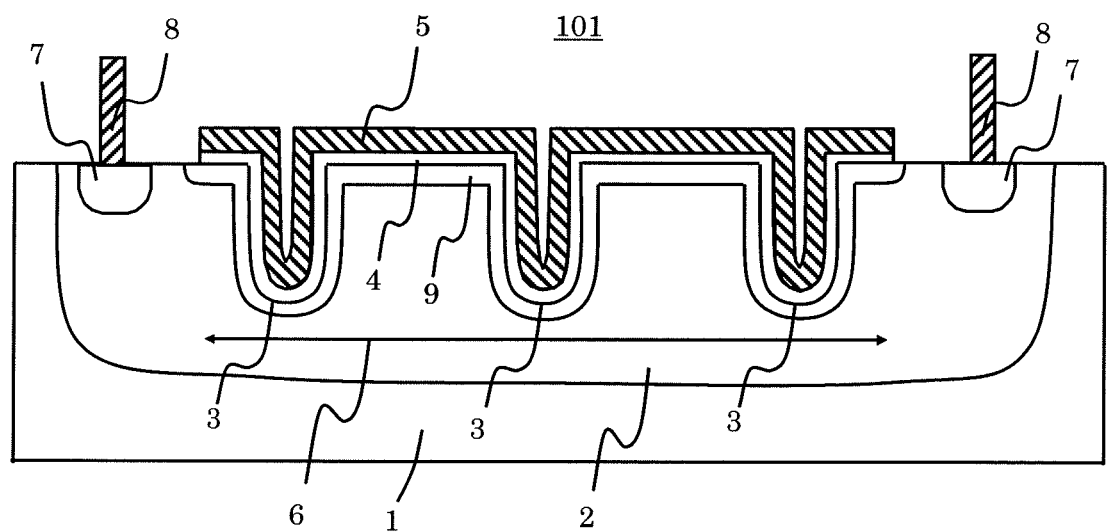
FIG. 2 is a cross-sectional view of a semiconductor device according to a second embodiment of the present invention.

FIG. 2 is a cross-sectional view of a semiconductor device 101 according to a second embodiment of the present invention. The semiconductor device 101 has the following structure. For example, in a p-type silicon substrate 1 having a resistance of 20 to 30 Ωcm, a lightly doped n-type well region 2 is formed to a depth of 20 μm with an impurity such as phosphorus at a concentration of about $1\times10^{16}$ cm$^{-3}$. Further, a heavily doped n-type region 7 to make contact with a substrate-side electrode 8 is formed on a part of a surface of the lightly doped n-type well region 2. The heavily doped n-type region 7 has a concentration of $1\times10^{20}$ cm$^{-3}$ and uses phosphorus or arsenic as an impurity species.

Subsequently, a plurality of trenches 3 each having a depth of 5 to 10 μm and an opening width of 2 to 3 μm are formed in a surface of the silicon substrate 1. On inner walls of the trenches 3 and the surface of the silicon substrate 1, a heavily doped n-type charge accumulation region 9 is formed. Note that the heavily doped n-type charge accumulation region 9 has a concentration of $1\times10^{18}$ to $1\times10^{20}$ cm$^{-3}$. Then, the silicon substrate 1 is thermally oxidized to form an oxide film 4 with a thickness of 500 Å on the surface of the silicon substrate 1 and the inner walls of the trenches 3. On the oxide film 4, a polysilicon film is deposited to a thickness of 4,000 Å, impurities are introduced to the polysilicon film to impart electrical conductivity, and then the polysilicon film is patterned to form a polysilicon electrode 5 on the lightly doped n-type well region 2 including the plurality of trenches 3. The electrode 5 is formed to have the same size as a size of the heavily doped n-type charge accumulation region 9. Then, an aluminum alloy is formed to a thickness of approximately 5,000 Å as the substrate-side electrode 8 on the heavily doped n-type region 7.

By forming the trenches 3 in the charge accumulation region 6 as described above, a contact area between the p-type silicon substrate 1 and the lightly doped n-type well region 2 may be reduced, and hence a leak current between the p-type silicon substrate 1 and the lightly doped n-type well region 2 may be reduced. Further, depletion of the polysilicon electrode 5 during application of a voltage may be prevented by forming the heavily doped n-type charge accumulation region 9.

What is claimed is:

1. A semiconductor device having a metal-oxide-semiconductor capacitor, the semiconductor device comprising:
   a silicon substrate of a first conductivity type;
   a lightly doped well region of a second conductivity type disposed by diffusing impurities into the silicon substrate;
   a charge accumulation region disposed in the lightly doped well region of the second conductivity type;
   a plurality of trenches disposed in the charge accumulation region;
   a heavily doped region of the second conductivity type disposed outside the charge accumulation region, and having a higher impurity concentration than an impurity concentration of the lightly doped well region of the second conductivity type;
   an oxide film disposed in the plurality of trenches disposed in the charge accumulation region, and on a surface of the silicon substrate of the first conductivity type;
   a polysilicon electrode disposed on the oxide film; and
   a substrate-side electrode disposed to make contact with the heavily doped region of the second conductivity type.

2. A semiconductor device having a metal-oxide-semiconductor capacitor, the semiconductor device comprising:
   a silicon substrate of a first conductivity type;
   a lightly doped well region of a second conductivity type disposed by diffusing impurities into the silicon substrate;
   a charge accumulation region disposed in the lightly doped well region of the second conductivity type;
   a plurality of trenches disposed in the charge accumulation region;
   a heavily doped region of the second conductivity type disposed outside the charge accumulation region, and having a higher impurity concentration than an impurity concentration of the lightly doped well region of the second conductivity type;
   a heavily doped charge accumulation region of the second conductivity type disposed in the plurality of trenches disposed in the charge accumulation region, and on a surface of the silicon substrate of the first conductivity type;
   an oxide film disposed on the heavily doped charge accumulation region of the second conductivity type;
   a polysilicon electrode disposed on the oxide film; and
   a substrate-side electrode disposed to make contact with the heavily doped region of the second conductivity type.

* * * * *